June 23, 1970 J. A. HALL, JR 3,516,914

ALUMINUM MASKING OF ACTIVE COMPONENTS DURING TANTALUM/NITRIDE SPUTTERING

Filed Feb. 26, 1968 2 Sheets-Sheet 1

INVENTOR
JOHN A. HALL, JR.
Melvin Pearson Williams
ATTORNEY

ALUMINUM MASKING OF ACTIVE COMPONENTS DURING TANTALUM/NITRIDE SPUTTERING

Filed Feb. 26, 1968 2 Sheets-Sheet 2

United States Patent Office 3,516,914

Patented June 23, 1970

3,516,914

ALUMINUM MASKING OF ACTIVE COMPONENTS DURING TANTALUM/NITRIDE SPUTTERING

John A. Hall, Jr., Warminster, Pa., assignor to United Aircraft Corporation, East Hartford, Conn., a corporation of Delaware Filed Feb. 26, 1968, Ser. No. 708,375

Int. Cl. C23c *15/00*

U.S. Cl. 204—192 1 Claim

ABSTRACT OF THE DISCLOSURE

A process for sputtering tantalum nitride resistors on silicon wafers having active components formed therein includes masking of the active components with evaporated aluminum during the tantalum nitride sputtering and etching.

BACKGROUND OF THE INVENTION

Field of invention

This invention relates to the manufacture of thin film integrated circuits, and more particularly to a method of protecting active components in a silicon wafer during the deposition and delineation of thin film passive elements thereon.

Description of the prior art

In the manufacture of integrated circuits on a wafer, it is necessary to form active components such as diffused transistors and diodes in the wafer prior to formation of resistors and conductors on the wafer. It is common to use evaporated aluminum to form the contacts for the active devices (typically referred to as metalization), and to use various tantalum/nitrogen sputtering techniques for the formation of resistors on the wafer. By sputtering tantalum in a nitrogen atmosphere, what is commonly referred to in the semiconductor art as tantalum nitride may be formed. This may be in either a monoatomic tantalum form or a diatomic tantalum form (TaN or $Ta_2N$).

Tantalum nitride sputtering techniques may result in degradation or destruction of the active devices formed in a wafer in several different ways. First, since sputtering is an electron bombardment process, the sputtering step may result in surface damage to the active components, even though they are covered with a passivation layer (such as silicon dioxide). A more important problem however is the fact that the acid solutions for delineating the resistors formed following the sputtering process are of the same type as is used for cutting silicon and silicon dioxide. Specifically, tantalum nitride sputtering is usually followed by a photomasking process and selective etching away of that material which is not desired to form part of the actual resistors which are required in a circuit. The acids used for this etching are typically solutions including hydrofluoric acid, acetic acid and nitric acid. Combinations of these acids are very effective in dissolving both raw and doped silicon as well as oxides of silicon. Although acid solutions may be chosen which have a much higher etch rate on the tantalum nitride than on silicon dioxide, so that by proper control of time, temperature and solution, the tantalum nitride may be selectively removed from an oxide surface without cutting all the way through an oxide surface, it cannot be sufficiently closely controlled to avoid any damage to the silicon oxide surface; and, more specifically, the damage which does result is sufficient to severely degrade if not totally ruin active components by removing sufficient oxide from the thin oxide region of the active component area, if not protected therefrom.

To partially overcome this, it has been common to form the metalization for the active components (that is, conductive paths or lands to which external contact is made with the active component) prior to the sputtering of tantalum nitride. In this prior procedure, aluminum contacts are formed for the devices, and the aluminum resists the sputtering itself, and the etchants used in delineating the tantalum nitride following the sputtering steps do not attack the aluminum to any great extent. However, it has been found, due to problems of registration and line control, it is difficult if not impossible in production operations to completely cover the active portions of the circuit with aluminum wherever there is not adequate depth of silicon oxide for the protection of the active components.

In another method known to the prior art, very weak solutions and long etching times are used to selectively remove tantalum nitride with a known amount of silicon destruction during the process. These processes do not afford adequate TaN etch factor control to delineate half mil or quarter mil resistor line widths, but rather tends to etch the edges so that rounded components of varying cross sectional area result.

Another method known to the prior art is to completely cover a wafer with aluminum, and then selectively remove the aluminum from those areas which are ultimately to consist of a film of tantalum nitride. Thereafter, the entire wafer is covered with tantalum nitride through sputtering techniques. Following that, the aluminum is etched from underneath the tantalum nitride, carrying the tantalum nitride with it in all areas except those where the aluminum was originally removed prior to the tantalum nitride sputtering. However, this process is extremely slow and unreliable, provides ragged edges to the components, and is quite expensive.

The gist of the problem lies in the fact that as successive oxide cuts are made, and successive new layers of oxide are grown during the diffusion processes in the preparation of the basic wafer, the last diffusion step (such as the diffusion of N+layers in NPN transistors) results in a very thin oxide at that point, in contrast to quite thick oxide over the remainder of the transistor. Thus, though thick oxide may protect the bulk of the wafer from being adversely affected by tantalum nitride etchants, the point that needs protection the most, i.e., at the active components, is the area of the wafer having the thinnest oxide and therefore the least protection against tantalum nitride etchants.

It is obvious that the procedures used in the prior art are not well suited to the production line manufacture of high quality integrated circuits utilizing both tantalum nitride passive elements and diffused active elements.

SUMMARY OF INVENTION

The object of the present invention is to provide a process for forming passive components on a wafer without injury to active components previously formed therein.

According to the present invention, active components formed in a wafer are fully protected with a layer of aluminum during the sputtering and etching of passive components on the wafer.

The foregoing and other objects, features and advantages of the present invention will become more apparent in the light of the following detailed description of a preferred embodiment thereof, as illustrated in the accompanying drawing.

DESCRIPTION OF THE PREFERRED EMBODIMENT

Figures 1, 2, 3, 4:
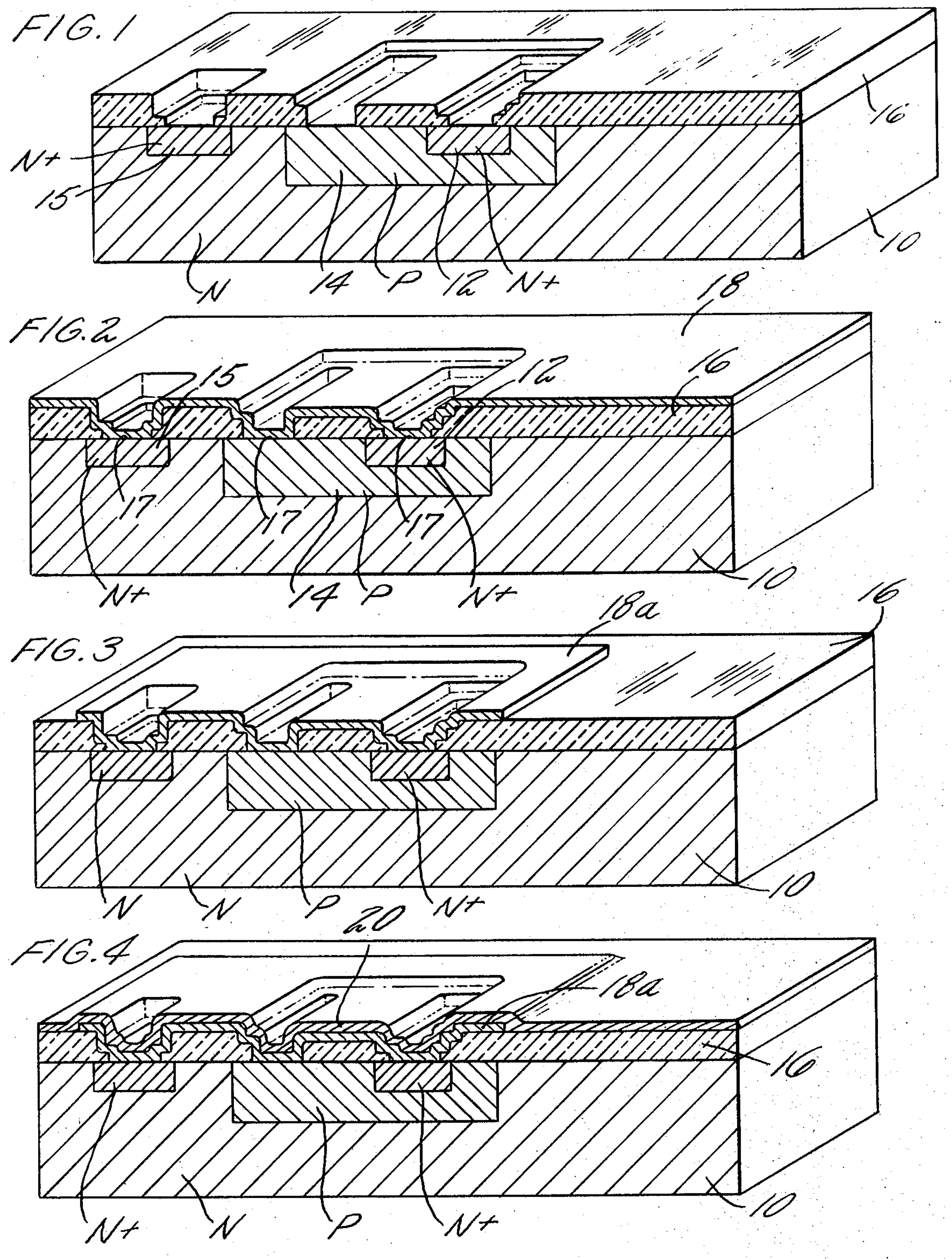
FIGS. 1 through 8 are sectioned perspective views of a corresponding sequence of steps in the manufacture of passive components on a wafer including active components, in accordance with the present invention.

Referring now to FIG. 1, a silicon wafer 10 may be doped so as to be N-type, and have diffused therein a P-type base 12 and an N+ emitter 14 so as to form a transistor. Also, an N+ region 15 is typically used to provide a highly conductive contact with the collector (the N-type substrate 10). Alternatively, the wafer 10 may be of P-type and a PNP transistor may be formed therein. Also, the invention is equally applicable to the protection of diodes, MOS devices, and other active components formed integrally within the wafer 10. It should be understood that the present example of the NPN transistor is chosen for simplicity only. Also, there may be an N+ or other highly conductive layer at the bottom of the wafer 10 formed either epitaxially or through deposition to enhance collector conduction, as is well known in the art. All of these features of the starting wafer material and the active components formed therein are not germane to the present invention, it being equally valuable in the protection of any type of active component formed in any type of semiconductive wafer. The wafer 10 typically has a layer of glass (an oxide of silicon) to passivate the active components. As shown in FIG. 1, the layer 16 is assumed to be silicon dioxide which is formed on the wafer in the final step of preparation of the active devices therein.

The first step in an exemplary embodiment of the present invention is the utilization of photomasking techniques so as to delineate contact areas for the metalization of the active components in the wafer. Typically, contact cuts 17 (FIG. 2) may be formed for the emitter, the base and the collector of transistors, and/or similar cuts may be made for each element of any active component which may be formed in the wafer. The contact cuts are made before forming the passive elements to avoid destroying the passive elements with the contact-cut etchant. After etching has formed the contact cuts 17 in the oxide layer 16, the next step is to evaporate the aluminum 18 over the entire surface of the wafer, which causes aluminum to be deposited uniformly over the oxide layer 16 where each contact cut 17 is made, and causes aluminum to be deposited uniformally over the oxide layer 16 wherever a contact cut is not made. The results of these two steps are illustrated in FIG. 2, wherein the aluminum layer 18 completely covers the wafer.

The third step in the process is to use photomasking techniques to mask off that portion of the aluminum which is within the contact cuts, and additional amounts of aluminum which is over the area of each of the active components in the wafer. Then an etchant such as phosphoric acid is used to remove aluminum from the remainder of the wafer, thereby leaving aluminum pads 18*a* completely covering each active component including the metalized contact areas of each active component. The result of this step of selective removal of aluminum is illustrated in FIG. 3. The fourth step in the process is to cover the entire wafer, including both the oxide surfaces and the aluminum surfaces with tantalum nitride through high vacuum sputtering techniques. This step is illustrated in FIG. 4. It is to be noted that aluminum is very difficult to sputter, and is therefore not materially affected during sputtering of the tantalum nitride.

Thereafter, the fifth step, of selectively removing all of the tantalum nitride which is not desired to form a resistor by photomasking and etching techniques, is employed. Typically, a solution of nitric, hydrofluoric, and acetic acids is used to remove the tantalum nitride; it is this step which renders the aluminum protection of the active components most beneficial since this etchant does not affect the aluminum appreciably.

Once the tantalum nitride resistors 20*a*, 20*b* are formed on the wafer, then all of the aluminum is stripped from the wafer by etching in a solution of phosphoric acid, or other suitable etchant. The result of this is illustrated in FIG. 6.

Figures 5, 6, 7, 8:
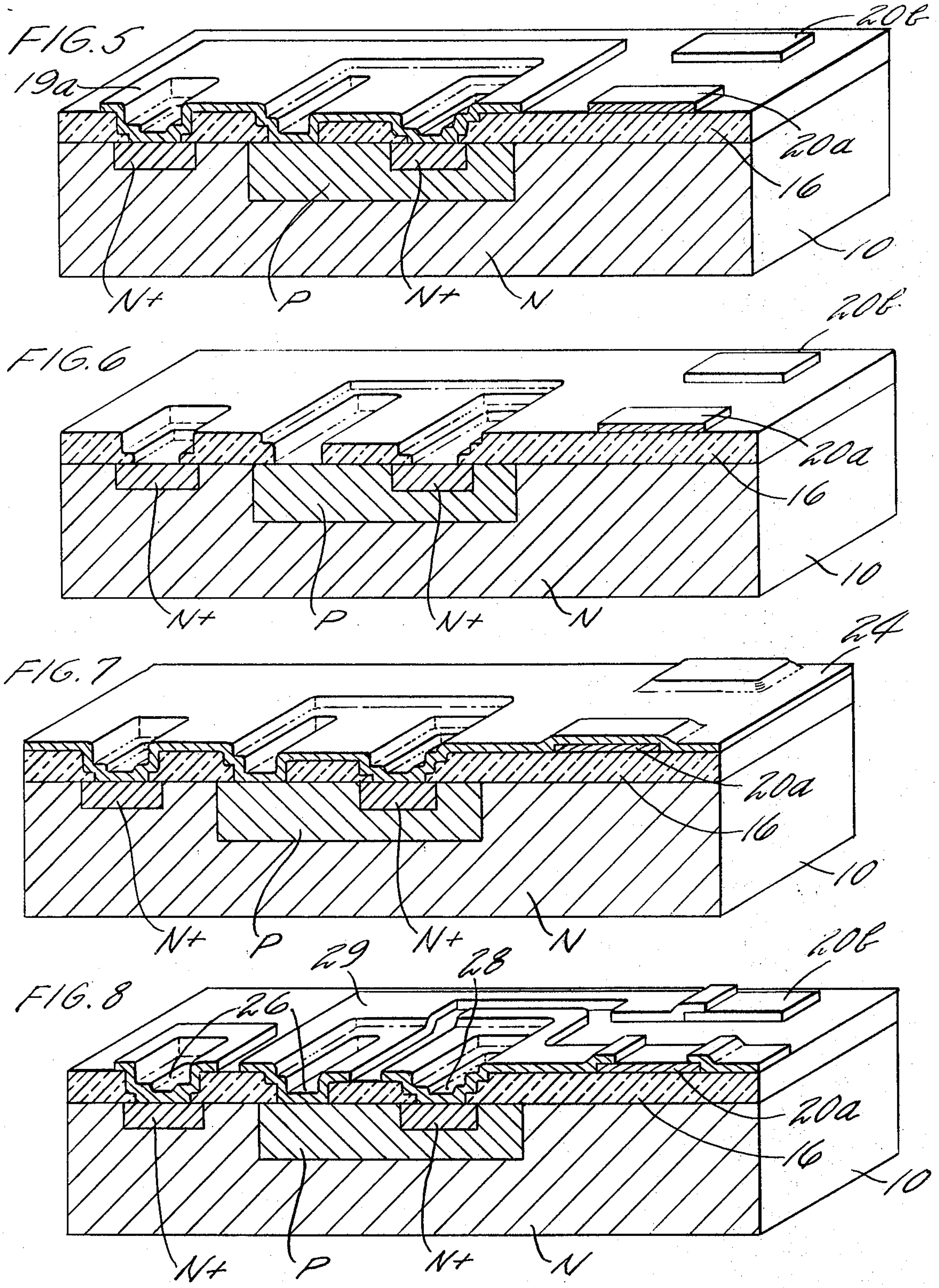

The seventh step of the process in accordance herewith is the deposition through evaporation techniques of aluminum 24 over the entire surface of the wafer, the result of which is shown in FIG. 7. Thereafter, using photomasking and selective etching techniques, the aluminum may be selectively removed so as to leave contact metalization 26 on the active components and to form conductors 28, 29 between the active, and the passive components or combinations thereof as desired so as to form a circuit. The result of this step is illustrated in FIG. 8.

The invention has been described in connection with a given process utilizing techniques known in the art. The particular example is shown for simplicity, and should not be construed as limiting the scope of the present invention. For instance, other metals and alloys thereof may be utilized in the process while practicing the advantages of the present invention. Similarly, various other changes in the form and detail may be made in the practice of the present invention without departing from the spirit and scope thereof, which is to be limited and defined only as set forth in the following claim.

Having thus described an illustrative embodiment of my invention, that which I claim as new and desire to secure by Letters Patent of the United States is:

1. In the formation of passive components on a silicon wafer including previously formed active components, the steps of:
   - preparing a wafer of semiconductive material having active components integrally formed therein and having a passivation layer across the surface thereof;
   - making contact cuts through the passivation layer for each element of said active components;
   - evaporating a thin layer of aluminum over the entire surface of the wafer including the surface within said contact cuts;
   - selectively removing aluminum from the surface of said wafer except in regions of said surface adjacent to any of said active components;
   - sputtering tantalum in a nitrogen ambient over the entire surface of said wafer to form a thin layer of tantalum nitride;
   - selectively removing tantalum nitride material from said surface so to leave tantalum nitride material in the configuration of desired passive components; and
   - stripping all remaining aluminum from said wafer.

References Cited

UNITED STATES PATENTS

| | | | |
|---|---|---|---|
| 3,450,581 | 6/1969 | Shortes | 204—192 |
| 3,436,327 | 4/1969 | Shockley | 204—192 |
| 3,325,258 | 6/1967 | Fottler et al. | 204—192 |
| 3,242,006 | 3/1966 | Gerstenberg | 204—192 |

JOHN H. MACK, Primary Examiner

S. S. KANTER, Assistant Examiner

U.S. Cl. X.R.

148—33.5, 187; 156—17; 317—235